United States Patent
Komatsu et al.

(10) Patent No.: US 11,495,045 B2
(45) Date of Patent: Nov. 8, 2022

(54) IMAGE ACQUIRING APPARATUS AND DISPLAY APPARATUS EQUIPPED THEREWITH

(71) Applicants: CONNECTEC JAPAN Corporation, Myoukou (JP); FUJIKIN INCORPORATED, Osaka (JP)

(72) Inventors: Hiroshi Komatsu, Niigata (JP); Akane Suzuki, Osaka (JP); Jun Kimura, Osaka (JP); Kensuke Kojima, Osaka (JP)

(73) Assignees: CONNECTEC JAPAN CORPORATION, Myoukou (JP); FUJIKIN INCORPORATED, Osaka (JP)

( * ) Notice: Subject to any disclaimer, the term of this patent is extended or adjusted under 35 U.S.C. 154(b) by 198 days.

(21) Appl. No.: 16/914,991

(22) Filed: Jun. 29, 2020

(65) Prior Publication Data
US 2020/0327298 A1 Oct. 15, 2020

Related U.S. Application Data

(63) Continuation of application No. PCT/JP2018/044413, filed on Dec. 3, 2018.

(30) Foreign Application Priority Data

Dec. 28, 2017 (JP) .............. JP2017- 253415

(51) Int. Cl.
G06V 40/13 (2022.01)
H04N 5/235 (2006.01)
(Continued)

(52) U.S. Cl.
CPC ........ G06V 40/1318 (2022.01); G06V 10/141 (2022.01); G06V 10/147 (2022.01); H04N 5/2352 (2013.01)

(58) Field of Classification Search
CPC .............. G06V 10/141; G06V 10/147; G06V 40/1318; H01L 27/14609; H01L 27/14625; H04N 5/2352
See application file for complete search history.

(56) References Cited

U.S. PATENT DOCUMENTS

| 11,270,095 B2* | 3/2022 | Shih ........................ G09G 3/20 |
| 2003/0174256 A1* | 9/2003 | Kim ................... G06V 40/1318 349/1 |

(Continued)

FOREIGN PATENT DOCUMENTS

| JP | S6110711 A | 1/1986 |
| JP | 2002245443 A | 8/2002 |

(Continued)

OTHER PUBLICATIONS

International Search Report for International application No. PCT/JP2018/044413; dated Jan. 8, 2019.

(Continued)

*Primary Examiner* — Amy R Hsu
(74) *Attorney, Agent, or Firm* — Cantor Colburn LLP

(57) ABSTRACT

An image acquiring apparatus includes: a light irradiation unit configured to be capable of radiating light modulated with a modulation signal in a predetermined frequency band; photosensors configured to be capable of receiving the light radiated from the light irradiation unit, the light including reflected light reflected by an object, and the photosensors being arranged in a matrix; and a generation unit configured to generate a DC component from an electrical signal output (Continued)

from the photosensor due to the light received by the photosensor on the basis of the predetermined frequency band or the modulation signal.

5 Claims, 3 Drawing Sheets

(51) Int. Cl.
*G06V 10/141* (2022.01)
*G06V 10/147* (2022.01)

(56) References Cited

U.S. PATENT DOCUMENTS

| | | | |
|---|---|---|---|
| 2004/0211960 A1* | 10/2004 | Joo | H01L 27/124 |
| | | | 257/E27.111 |
| 2006/0017862 A1* | 1/2006 | Song | G02F 1/13338 |
| | | | 349/42 |
| 2010/0046807 A1* | 2/2010 | Sato | G06V 10/141 |
| | | | 250/580 |
| 2018/0046281 A1* | 2/2018 | Pi | G06F 3/0421 |
| 2018/0075271 A1* | 3/2018 | Xu | G06V 40/1318 |
| 2019/0042825 A1* | 2/2019 | He | G09G 3/3233 |
| 2021/0334501 A1* | 10/2021 | Song | G06V 40/1318 |

FOREIGN PATENT DOCUMENTS

| | | | |
|---|---|---|---|
| JP | 2003287731 | A | 10/2003 |
| JP | 2004326806 | A | 11/2004 |
| JP | 2006503333 | A | 1/2006 |
| JP | 2006086333 | A | 3/2006 |
| JP | 2008217358 | A | 9/2008 |
| JP | 2009064071 | A | 3/2009 |

OTHER PUBLICATIONS

TW Office Action for corresponding TW application No. 10821137850 dated Nov. 28, 2019.
EPO Extended European Search Report for EP Application No. 18897291.3; dated Sep. 6, 2021.
Internet Publication "Signal Recovery—What Is A Lock-In Amplifier?", Signal Recovery, 2008 AMETEK Advanced Measurement Technology Inc.; Retrieved from the Internet Archive; Sep. 28, 2016; 4 pages.

* cited by examiner

OUTPUT SIGNAL

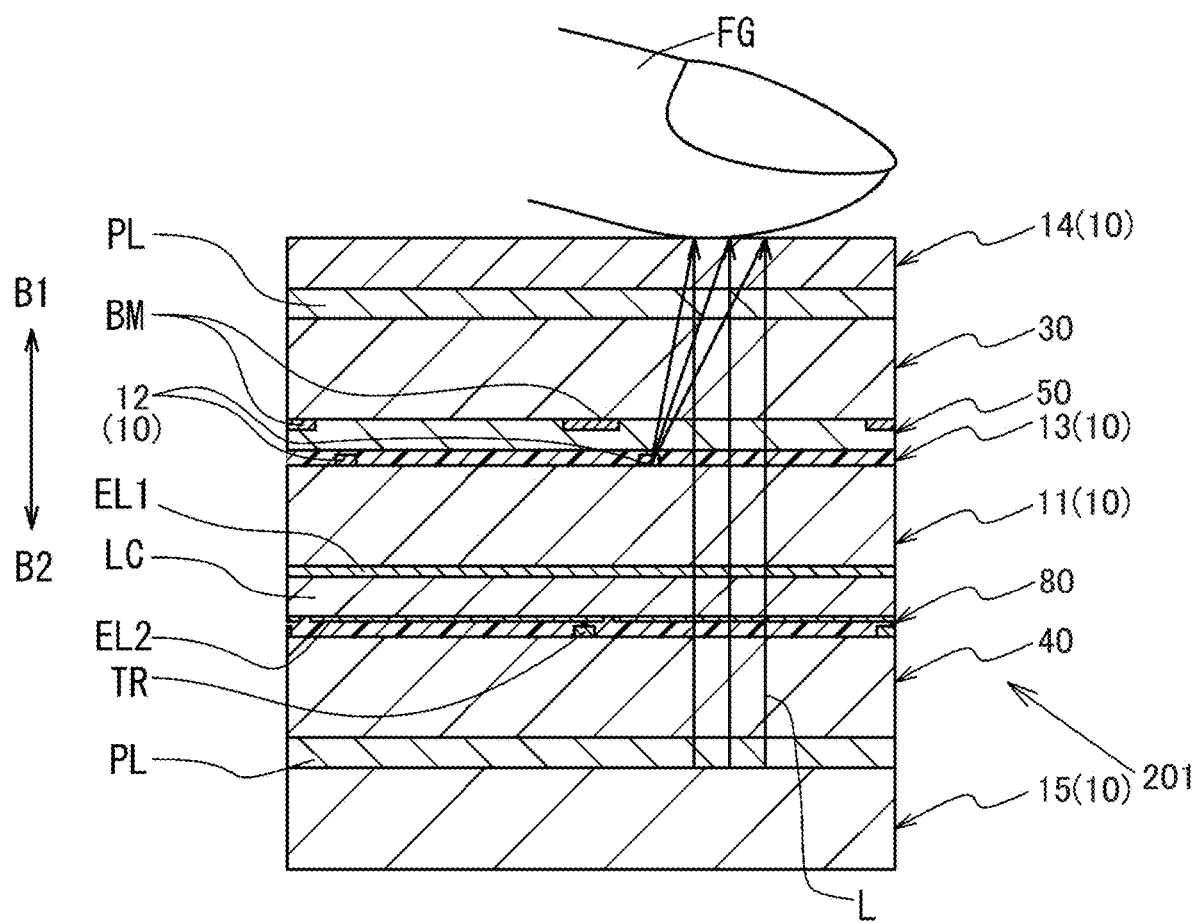

IMAGE ACQUIRING APPARATUS AND DISPLAY APPARATUS EQUIPPED THEREWITH

CROSS REFERENCE TO RELATED APPLICATION

This application is a continuation application of International Application No. PCT/JP2018/044413, filed Dec. 3, 2018, which claims priority to Japanese Patent Application No. 2017-253415, filed Dec. 28, 2017. The contents of these applications are incorporated herein by reference in their entireties.

TECHNICAL FIELD

The present disclosure relates to an image acquiring apparatus capable of acquiring an image of a fingerprint or the like of a person, and a display apparatus equipped therewith.

BACKGROUND

Japanese Patent Application Publication Nos. 2003-287731, 2004-326806, 2006-503333, 2006-086333, 2002-245443, and 2009-064071 and the like disclose a liquid crystal display and an organic EL display in which a fingerprint sensor using a photosensor is integrated.

SUMMARY

In the displays disclosed in the above Japanese Patent Application Publications and the like, excluding an influence of external light from sunlight is not considered, and it is difficult to capture a fingerprint image based on reflected light of a backlight outdoors.

An object of the present disclosure is to provide an image acquiring apparatus capable of imaging an object even outdoors, and a display apparatus equipped therewith.

An image acquiring apparatus according to one embodiment of the present disclosure includes: a light irradiation unit configured to be capable of radiating light modulated with a modulation signal in a predetermined frequency band; photosensors configured to be capable of receiving the light radiated from the light irradiation unit, the light including reflected light reflected by an object, and the photosensors being arranged in a matrix; and a generation unit configured to generate a DC component from an electrical signal output from the photosensor due to the light received by the photosensor on the basis of the predetermined frequency band or the modulation signal.

A display apparatus according to one embodiment of the present disclosure includes the above image acquiring apparatus.

BRIEF DESCRIPTION OF THE DRAWINGS

In the drawings:

FIG. 3 is a cross-sectional view of a portion of a display apparatus.

DETAILED DESCRIPTION

Hereinafter, embodiments of the present disclosure will be described with reference to the drawings.

First Embodiment

Figure 1:
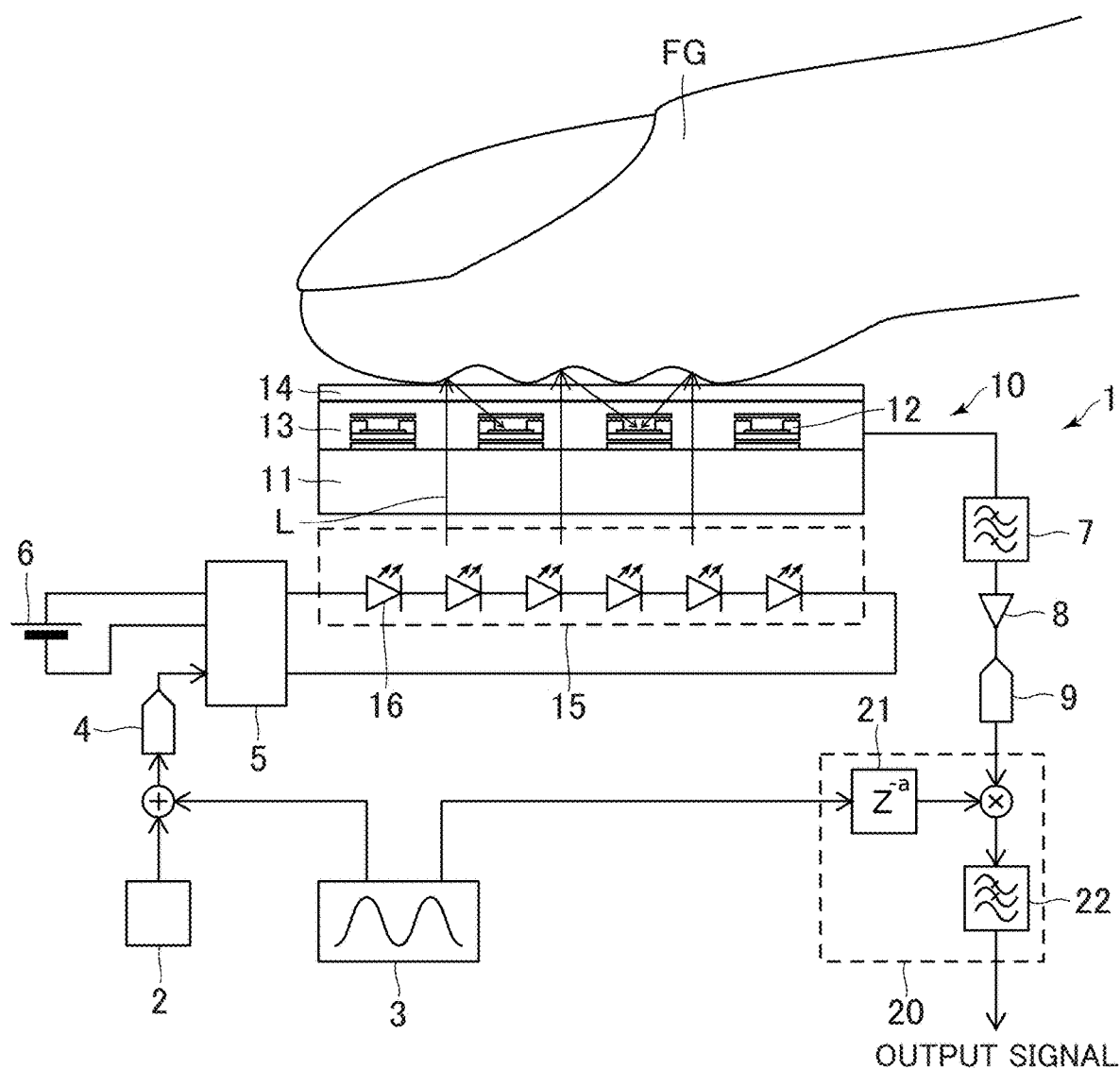
FIG. 1 is a schematic diagram of an image acquiring apparatus according to a first embodiment.

FIG. 1 is a schematic diagram of an image acquiring apparatus 1 according to a first embodiment of the present disclosure.

The image acquiring apparatus 1 illustrated in FIG. 1 is an apparatus for acquiring an image (moving image) of an object such as a fingerprint. The image acquiring apparatus 1 includes a sensor unit 10, a brightness instruction value generation unit 2, a modulation signal generation unit 3, a DA converter 4, a current source 5, a band pass filter 7, an amplifier 8, an AD converter 9, and a signal comparison unit 20.

The sensor unit 10 includes a glass substrate 11, a photosensor 12, a protective insulating film 13, a cover glass 14, and a backlight 15.

The glass substrate 11 is a transparent substrate, and an array of photosensors 12 arranged in a matrix in portion or all of a sensor front surface is formed on a front surface side of the glass substrate 11. Although a method of performing measurement with one photosensor 12 will be described in the following description and drawings, measurement may be performed over all or a part of the array of photosensors 12 by parallelizing a plurality of measurement circuits or switching between the photosensors 12 for measurement using a switch element (not illustrated) to perform the measurement.

Each photosensor 12 is a photoelectric conversion element in which a semiconductor film is used as a light reception portion, and outputs a voltage signal (electrical signal) according to the intensity of incident light. Reflected light that is radiated from a light irradiation unit, reflected by a finger FG, and travels from a front surface side to an opposite non-front surface side of the device, and/or external light such as sunlight is incident on each photosensor 12. The photosensor 12 is, for example, a thin film transistor (TFT) having a well-known double gate structure, or an LED.

The photosensor 12 is covered with the protective insulating film 13. The protective insulating film 13 has a function of protecting an interface of the semiconductor film of the photosensor 12, has an insulating property and transparent to light, and is formed of, for example, silicon nitride or silicon oxide.

The cover glass 14 is provided on the protective insulating film 13. By a finger FG of a human body being brought into contact with a front surface of the cover glass 14, a fingerprint image (moving image) can be captured as will be described below.

The backlight 15 serving as a light source is provided below the glass substrate 11. A well-known backlight is adopted as the backlight 15, and for example, the backlight 15 is configured of a plurality of LEDs 16. Light L from the backlight 15 is reflected by the finger FG placed on the cover glass 14, and reflected light thereof is incident on each photosensor 12.

The brightness instruction value generation unit 2 generates and outputs a brightness instruction value (current value) for radiating light with a desired brightness from the backlight 15.

The modulation signal generation unit 3 generates and outputs a modulation signal in a predetermined frequency band, such as a sine wave modulation signal at a predetermined frequency. Since the signal comparison unit 20 to be described below can also be regarded as performing correlation measurement, the modulation signal may be any other signal including a frequency band convenient for modulation and having an average value of zero, such as pseudo random noise or a pseudo white binary signal. The frequency band may be a frequency band which is low such that responses of the current source 5, the photosensor 12, and the backlight 15 catch up with and which is high such that flickering of the LED 16 is not noticeable. For example, when the TFT is used as the photosensor 12, a response speed thereof is substantially determined by a mobility $\mu e$ of the TFT and can be a maximum of about 10 MHz. Further, in general, since a noise component decreases as the frequency increases, selection of a higher frequency can result in a decrease in an S/N ratio or a size of a filter. Further, it is preferable to avoid an integer multiple of another frequency used in the image acquiring apparatus 1, for example, a sweep frequency. A frequency band of the modulation signal is, for example, 1 to 5 kHz. The brightness instruction value generated by the brightness instruction value generation unit 2 is modulated by a modulation signal and input to the DA converter 4 as a modulation instruction value. Further, the modulation signal generated by the modulation signal generation unit 3 is also output to a delay unit 21 of the signal comparison unit 20 to be described below.

The DA converter 4 converts the brightness instruction value input as a digital signal to an analog signal, and outputs the analog signal to a current instruction value input of the current source 5.

The current source 5 changes a current from a power supply 6 to a current value according to the modulation instruction value, and outputs the current value to the backlight 15. For example, an LED driver IC using a switching power supply or an active matrix type LED drive circuit is used as the current source 5.

The band pass filter 7 is a filter that mainly passes only a specific frequency component of the voltage signal output from the photosensor 12. Since the voltage signal output from the photosensor 12 due to external light is mostly DC or low frequency components close to DC, an unnecessary DC component and low frequency component are cut off in the measurement. Thereby, it is possible to effectively use a measurement range in the AD converter 9 to be described below for measurement of a modulation component, and to improve an S/N ratio.

The amplifier 8 amplifies the voltage signal that has passed through the band pass filter 7.

The AD converter 9 converts the voltage signal amplified as an analog signal into a digital signal.

The signal comparison unit 20 includes the delay unit 21 and a low pass filter 22. The delay unit 21 delays the modulation signal from the modulation signal generation unit 3. This is because there is a time difference between a timing at which the modulation signal output from the modulation signal generation unit 3 to the DA converter 4 is reflected by the finger FG and then is incident on the signal comparison unit 20 and a timing at which the modulation signal from the modulation signal generation unit 3 is directly input to the signal comparison unit 20. For example, the modulation signal is delayed by a clocks for correction of the time difference. That is, the modulation signal from the modulation signal generation unit 3 is synchronized with the voltage signal from the photosensor 12.

The low pass filter 22 passes a signal at a frequency lower than the frequency band of the modulation signal in a signal obtained by multiplying the delayed modulation signal by the amplified voltage signal, with a frequency lower than the frequency band of the modulation signal being a cutoff frequency, and outputs the signal as an output signal (image signal). Thereby, an AC component in a signal obtained by multiplying the voltage signal output from the photosensor 12 due to the reflected light from the finger FG by the modulation signal is removed by the low pass filter 22, and a low frequency component around a DC is output as an output signal (image signal). The cutoff frequency is determined on the basis of a frequency band of an entire fingerprint sensor system including the image acquiring apparatus 1, the finger FG, and the like. Thus, correlation measurement or homodyne detection (synchronous detection) is performed in the signal comparison unit 20, and the low pass filter 22 is, for example, a FIR filter, an IIR filter, or a combination thereof. Further, the low pass filter 22 may be implemented as a filter that integrates a signal for a time that is an integral multiple of a time of a repetition period of the modulation signal. This filter can also be regarded as a low pass filter with a frequency lower than the frequency band of the modulation signal being a cutoff frequency, but is a filter capable of reliably removing the frequency component of the modulation signal while widening a pass band of the low pass filter 22.

An image (moving image) of a fingerprint of the finger is created in a control unit (not illustrated) on the basis of the output signal output from the low pass filter 22.

With the image acquiring apparatus 1 according to the embodiment, the light irradiation unit capable of radiating the light modulated with the modulation signal at a predetermined frequency is included, and a DC component is generated from the voltage signal output from the photosensor 12 due to the light received by the photosensor 12 on the basis of a predetermined frequency band or the modulation signal. The image acquiring apparatus 1 includes the band pass filter 7 that cuts off a DC component caused by external light in the voltage signal, and the low pass filter 22 that passes a DC component in a signal obtained by multiplying the voltage signal that has passed through the band pass filter 7 by the modulation signal synchronized with the voltage signal, with a frequency lower than the frequency band being a cutoff frequency.

Thus, it is possible to cut off the DC component caused by the external light from the voltage signal detected by the photosensor 12 by modulating the light from the backlight 15 and to obtain a voltage signal on which an influence of the external light has been curbed. Thereby, it is possible to provide the image acquiring apparatus 1 capable of imaging an object even outdoors.

Further, the light irradiation unit includes the backlight 15, a brightness instruction value generation unit 2 that generates the brightness instruction value for the backlight 15, and the modulation signal generation unit 3 that generates the modulation signal for modulating the brightness instruction value with a predetermined frequency. Thereby, it is possible to modulate the light from the backlight 15 with a simple configuration without making a significant change to a normal backlight drive circuit.

Second Embodiment

Figure 2:
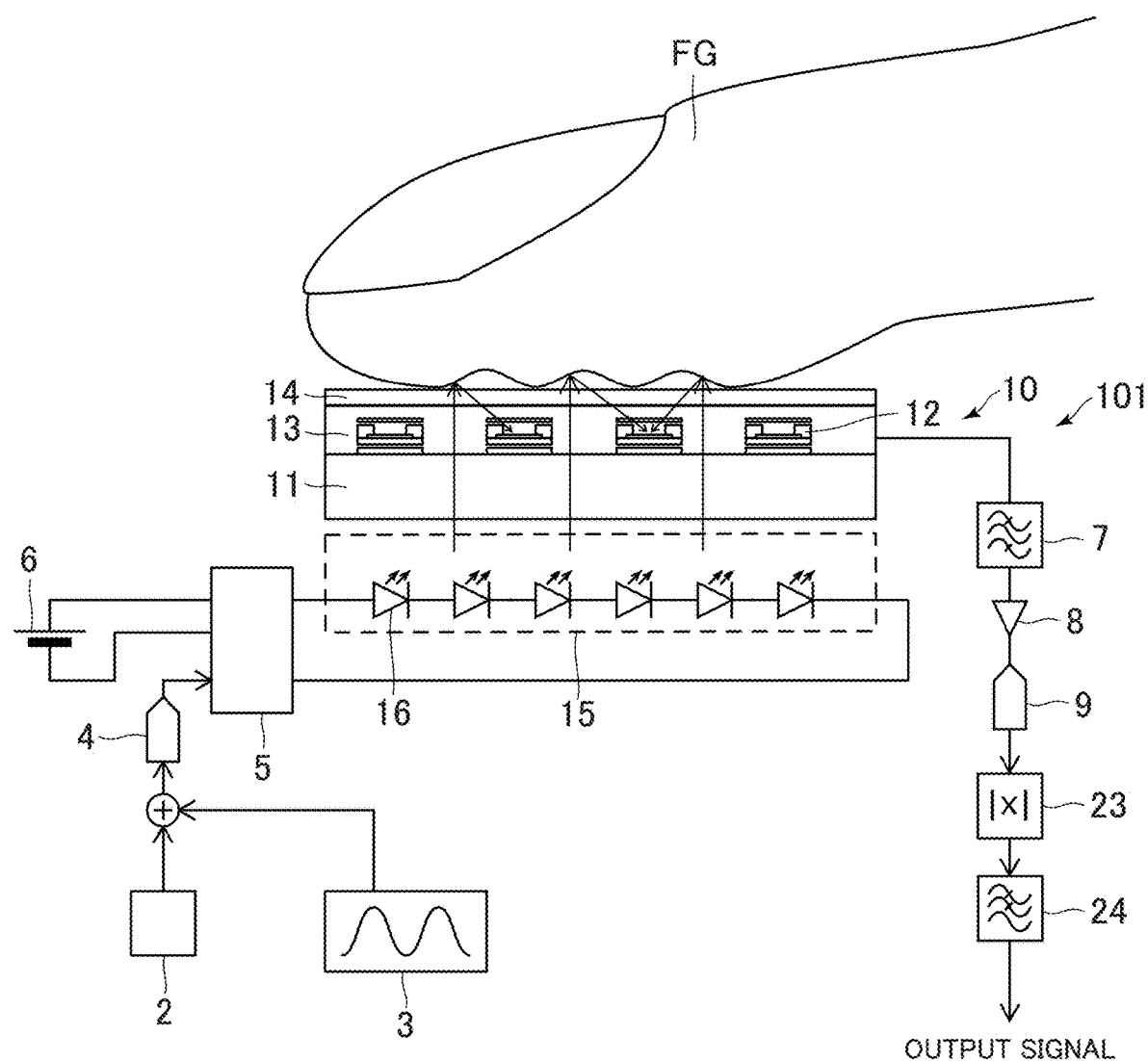
FIG. 2 is a schematic diagram of an image acquiring apparatus according to a second embodiment.

FIG. 2 is a schematic diagram of an image acquiring apparatus 101 according to a second embodiment of the present disclosure. In the image acquiring apparatus 101 illustrated in FIG. 2, the same components as those in the first embodiment are denoted by the same reference signs.

An absolute value unit 23 and a low pass filter 24 are included in place of the signal comparison unit 20 of the first embodiment, as illustrated in FIG. 2.

The predetermined frequency generated by the modulation signal generation unit 3 in the second embodiment is determined on the basis of the entire sensor system including the image acquiring apparatus 101, the finger FG, and the like, as in the first embodiment. For example, the predetermined frequency is determined to be low such that the responses of the current source 5 and the backlight 15 catch up with and flickering of the LED 16 is not noticeable. Although the modulation signal is, for example, a sine wave, the modulation signal may be a rectangular wave or a triangular wave.

The band pass filter 7 in the second embodiment is a filter in which a narrow range including a frequency of the modulation signal generated by the modulation signal generation unit 3 is a pass band. A range of the pass band is determined on the basis of the frequency band of the entire sensor system including the image acquiring apparatus 101, the finger FG, and the like.

The absolute value unit 23 converts a negative component of the voltage signal from the AD converter 9 to a positive component. That is, the absolute value unit 23 obtains an absolute value of an amplitude of the voltage signal. This is preprocessing for processing the voltage signal in the next low pass filter 24. Although a process in the absolute value unit 23 is digital processing in the second embodiment, a bridge rectifier circuit may be used when analog processing is performed.

The low pass filter 24 passes a signal at a frequency lower than the frequency of the modulation signal in the voltage signal subjected to absolute value processing in the absolute value unit 23, with the frequency lower than a frequency band of the modulation signal being a cutoff frequency, and outputs the signal as an output signal. Thereby, an AC component of the voltage signal output from the photosensor 12 due to the reflected light from the finger FG is removed by the low pass filter 24, and a component around the DC is output as an output signal (color image signal). The cutoff frequency (the range of the pass band) is determined on the basis of the frequency band of the entire sensor system including the image acquiring apparatus 101, the finger FG, and the like.

A control unit (not illustrated) creates an image (moving image) of a fingerprint of the finger on the basis of the output signal output from the low pass filter 24.

The image acquiring apparatus 101 according to the second embodiment includes the band pass filter 7 in which a frequency band is a pass band of the electrical signal, and the low pass filter 24 that passes a DC component in a signal based on the voltage signal that has passed through the band pass filter 7, with a frequency lower than the frequency band being a cutoff frequency. With this configuration, it is possible to cut off the DC component caused by the external light from the voltage signal detected by the photosensor 12 and to obtain a voltage signal on which an influence of the external light has been curbed. Thereby, it is possible to provide the image acquiring apparatus 1 capable of imaging an object even outdoors.

Next, a display apparatus 201 including the image acquiring apparatus 1 or 101 will be described.

FIG. 3 is a cross-sectional view in which a portion of the display apparatus 201 is cut off.

The display apparatus 201 is a thin film transistor (TFT) type active matrix liquid crystal display. Since a configuration of the active matrix liquid crystal display is known, detailed description of the known configuration will be omitted in the following description. Among directions B1 and B2, B1 indicates a display surface side, and B2 indicates a non-display surface side opposite to the display surface side. In FIG. 3, illustration of components other than the sensor unit 10 is omitted.

The glass substrates 30, 11, and 40 are provided as transparent substrates in that order from the display surface side B1 to the non-display surface side B2, as illustrated in FIG. 3. A plastic substrate such as polycarbonate can be adopted in place of the glass substrate.

A polarizing element PL is provided on the display surface side B1 of the glass substrate 30, and a transparent cover glass 14 is provided on the polarizing element PL. By the finger FG of the human body being brought into contact with the front surface of the cover glass 14, a color fingerprint image can be captured as will be described below.

A color filter 50 is provided on the non-display surface side B2 of the glass substrate 30 as a filter that selectively transmits light with a predetermined color.

The color filter 50 includes a light-shielding black matrix BM formed in a lattice form on the front surface of the glass substrate 30 in correspondence with each pixel of a screen, and three colored portions (R, G, B) that transmit light with a predetermined color. Although various materials can be adopted as a material of the black matrix BM, a metal chromium film can be adopted for reasons such as a light-shielding property, ease of manufacture, and corrosion resistance. The three colored portions (R, G, B) are formed of a known resist material, and are, for example, an organic resin material containing a pigment.

Switching elements TR each made of a thin film transistor (TFT) are formed in a matrix form in correspondence with each pixel on the display surface side B1 of a glass substrate 40, and a pixel electrode EL2 is formed in a matrix form on the switching element TR via a protective insulating film 80. A known low-temperature poly-Si (LTPS) type or an amorphous Si type is adopted as the TFT.

A common electrode EL1 facing the pixel electrode EL2 is formed on the non-display surface side B2 of the glass substrate 11. The common electrode EL1 and the pixel electrode EL2 are formed of a transparent conductive film such as indium tin oxide (ITO).

A well-known liquid crystal material LC is filled between the common electrode EL1 and the pixel electrode EL2.

The polarizing element PL is provided on the non-display surface side B2 of the glass substrate 40, and the backlight 15 serving as a light source is provided on the polarizing element PL. A well-known backlight is adopted as the backlight 15.

The array of photosensors 12 arranged in a matrix form on a portion of a screen of the display apparatus is formed on the display surface side B1 of the glass substrate 11. In the embodiment, a single photosensor 12 is provided for each pixel, but the present disclosure is not limited thereto and a plurality of photosensors 12 can also be provided for one pixel. The protective insulating film 13 covers the photosensor 12. With the array of photosensors 12, light passing through the three colored portions (R, G, B) of the color filter 50 from the display surface side B1 to the non-display surface side B2 is received, thereby capturing a color image. It is possible to avoid a decrease in yield, which is a problem when the number of processes for the same substrate increases, by separately providing the glass substrate 11 on which the photosensors 12 are mounted.

The light L from the backlight 15 is reflected by a finger FG placed on the cover glass 14, and the reflected light passes through the three colored portions (R, G, B) of the color filter 50 and is incident on each of the photosensors 12, as illustrated in FIG. 3. Thereby, it is possible to capture a color image of the fingerprint.

The respective layers are formed on the glass substrates 30, 11, and 40 by appropriately performing a film forming process such as a well-known PVD method or CVD method, a mask process such as a photolithography method, and a thin film shape processing process such as an etching method. The glass substrate 30 and the glass substrate 11 are then bonded to each other using an adhesive such as an ultraviolet curing resin, with the color filter 50 and the photosensor 12 facing each other. The display apparatus 201 is manufactured through steps such as bonding the glass substrate 40 thereto and injecting a liquid crystal material LC.

With the display apparatus 201, it is possible to provide a display apparatus 201 including the image acquiring apparatus 1 or 101 capable of imaging an object even outdoors.

Embodiments are not limited to the above-described embodiments. A person skilled in the art can perform various additions or changes without departing from the scope of the present disclosure.

The image acquiring apparatus 1 according to the first embodiment may not include the band pass filter 7. The signal comparison unit 20 can cut off the DC component caused by the external light from the voltage signal detected by the photosensor 12 and obtain a voltage signal on which an influence of the external light has been curbed, without the band pass filter 7.

Although the image acquisition of the image acquiring apparatus 1 or 101 described above is performed in both analog and digital manners, all the processes may be performed in an analog manner, all the processes may be performed in a digital manner, or the signal processing may be performed by software on a processor such as a digital signal processor. Each various filter is implemented as analog filter or digital filter depending on the form of the circuit. Further, although the absolute value unit 23 described above obtains the absolute value of the amplitude of the voltage signal in the image acquiring apparatus 101, the voltage signal may be squared.

Further, an IPS scheme, a VA scheme, or the like may be used in place of a TN scheme as a liquid crystal display scheme, or a passive matrix scheme or the like may be used in place of an active matrix scheme as a driving scheme. Further, the display apparatus 201 is not limited to the liquid crystal display, but may be an organic EL display or a micro LED display. When the organic EL display is used as the display apparatus 201, an LED for a display itself can also serve as both the backlight 15 and the photosensor 12 and a simple structure can be achieved.

What is claimed is:

1. An image acquiring apparatus comprising:
a light irradiation unit configured to be capable of radiating light modulated with a modulation signal in a predetermined frequency band;
photosensors configured to be capable of receiving the light radiated from the light irradiation unit, the light including reflected light reflected by an object, and the photosensors being arranged in a matrix; and
a generation unit configured to generate a DC component from an electrical signal output from the photosensor due to the light received by the photosensor on the basis of the predetermined frequency band or the modulation signal,
wherein
the generation unit includes
a band pass filter configured to cut off a DC component caused by external light in the electrical signal; and
a low pass filter configured to pass the DC component from a signal obtained by multiplying the electrical signal that has passed through the band pass filter by the modulation signal synchronized with the electrical signal, with a frequency lower than the predetermined frequency band being a cutoff frequency.

2. The image acquiring apparatus according to claim 1, wherein the light irradiation unit includes
a light source;
a brightness instruction value generation unit configured to generate a brightness instruction value for the light source; and
a modulation signal generation unit configured to generate a modulation signal for modulating the brightness instruction value with the predetermined frequency band.

3. The image acquiring apparatus according to claim 1, wherein
the generation unit includes
a band pass filter in which the predetermined frequency band is included in a pass band of the electrical signal; and
a low pass filter configured to pass the DC component from a signal based on the electrical signal that has passed through the band pass filter, with a frequency lower than the predetermined frequency band being a cutoff frequency.

4. The image acquiring apparatus according to claim 1, wherein
the generation unit includes a low pass filter configured to pass the DC component from a signal obtained by multiplying the electrical signal output from the photosensor by the modulation signal synchronized with the electrical signal, with a frequency lower than the predetermined frequency band being a cutoff frequency.

5. A display apparatus comprising the image acquiring apparatus according to claim 1.

* * * * *